United States Patent [19]

Massini, Jr. et al.

[11] Patent Number: 5,533,663
[45] Date of Patent: * Jul. 9, 1996

[54] SOLDER WAVE MEASUREMENT DEVICE

[75] Inventors: Anthony L. Massini, Jr., Palm Harbor; Roy D. Shepard, Largo, both of Fla.

[73] Assignee: AT&T Corp., Murray Hill, N.J.

[*] Notice: The portion of the term of this patent subsequent to Nov. 21, 2014, has been disclaimed.

[21] Appl. No.: 342,561

[22] Filed: Nov. 21, 1994

[51] Int. Cl.⁶ .............................. H05K 3/34; B23K 3/06
[52] U.S. Cl. ........................................ 228/103; 228/56.5
[58] Field of Search ................................ 224/102, 11, 9, 224/37, 103, 56.5

[56] References Cited

U.S. PATENT DOCUMENTS

| | | | |
|---|---|---|---|
| 4,180,199 | 2/1978 | O'Rourke | 228/102 |
| 4,632,291 | 12/1986 | Rahn et al. | 228/9 |
| 5,023,848 | 5/1989 | Frey et al. | 368/1 |
| 5,388,468 | 2/1995 | Sasson | 228/56.5 |

FOREIGN PATENT DOCUMENTS

| | | | |
|---|---|---|---|
| 0269822 | 6/1988 | European Pat. Off. | 228/37 |
| 62-267065 | 11/1987 | Japan | 228/103 |
| 3-220973 | 9/1988 | Japan | 228/37 |
| 1-104465 | 4/1989 | Japan | 228/11 |

Primary Examiner—P. Austin Bradley
Assistant Examiner—Jeffrey T. Knapp
Attorney, Agent, or Firm—Joseph J. Opalach

[57] ABSTRACT

In a wave solder manufacturing process, a test device is used to measure the contact-area between a solder wave and a printed wiring board. In particular, the test device is a printed wiring board (PWB) that includes at least two arrays of electrical contacts, one array near each side of the PWB. As the PWB makes contact with a solder wave, the number of electrical contacts in each array that are grounded by the solder wave are counted and displayed on an alpha-numeric display mounted on top of the PWB. This "distance-based" measurement provides an accurate determination of the uniformity of the contact-area, and concomitantly the dwell-time of the soldering process.

12 Claims, 7 Drawing Sheets

SOLDER WAVE MEASUREMENT DEVICE

CROSS-REFERENCE TO RELATED APPLICATION

Related subject matter is disclosed in the co-pending, commonly assigned, U.S. Patent application of Massini et al., entitled "Adjustment of a Solder Wave Process in Real-Time," Ser. No. 08/342,352; filed on Nov. 21, 1994.

BACKGROUND OF THE INVENTION

The present invention relates to manufacturing equipment and, more particularly, to wave solder machines.

Generally speaking, in a wave soldering machine a printed wiring board (PWB) is moved by conveyor on an inclined path past a fluxing station, a preheating station, and, finally, a station at which a wave of solder is caused to well upwardly and contact various portions of the PWB to be soldered. The efficiency of this wave soldering process is affected by a number of concerns, two of which are known in the art as the "contact-area" and the "dwell-time." The dwell-time represents the amount of time any given area of the PWB is in actual contact with the solder. Generally, the dwell-time is related to the contact-area and can be determined by simply dividing the length of the contact-area, which is in the direction of travel, by the speed of the conveyor belt.

The contact-area represents that portion of the PWB that is in actual contact with the solder wave, i.e., the area of the PWB that is currently covered by the solder wave. It is preferable to have a contact-area that is uniform, i.e., not uneven. A uniform contact-area is one where the dwell-time is the same for all portions of the PWB. For example, for a rectangular shape all portions of the PWB perpendicular to the direction of motion enter, and leave, the solder wave at approximately the same time. However, if the contact-area is not uniform, then some portions of the PWB are within the solder bath longer than other portions, i.e., the dwell-time changes across the PWB. If the dwell-time is too short, the soldering process may not be completed. On the other hand if the dwell-time is too long, the PWB may become too soft and begin to sag. For example, if the contact-area is trapezoidal (with the parallel sides in the direction of travel), one side of the PWB maintains contact with the solder longer than the opposite side.

One method for measuring the solder wave contact-area and the dwell-time is to use a tempered glass plate that is passed over the solder wave during a "test pass." This glass plate has a set of grid lines of known dimensions. As the glass plate passes over the solder wave, the contact-area is visually observed, and approximately measured via the grid lines, by an operator of the solder wave machine. From the observed contact-area, the dwell-time is determined by dividing the length of the contact-area, i.e., that dimension in the direction of motion of the conveyor belt, by the speed of the conveyor belt.

Unfortunately, this method for measuring the contact-area is purely subjective and only yields an approximation of the contact-area. In addition, in order to observe the contact-area on the glass plate, the wave soldering machine conveyor speed must be slowed so that the operator has time to observe the glass plate.

Other methods known in the art address the determination of dwell-time but, overall, assume a uniform contact-area. For example, U.S. Pat. No. 5,023,848, issued Jun. 11, 1991 to Frey et al., addresses the problem of determining an accurate dwell-time in the presence of "drag-out." The latter effect is when solder tends to hang on to one lead, or leads, longer than other leads. In this approach, a test device includes two electrical contacts, each contact located at opposite ends of the test device. As the test device passes through a solder wave, the latter provides the electrical connectivity between this pair of electrical contacts. Eventually, the test device moves out of the solder wave, and the electrical connectivity between the pair of electrical contacts is broken. A timer measures the time duration of the electrical connectivity between the contacts. This time duration is used to represent the dwell time. Since only two electrical contacts are used, a uniform contact-area is presumed. Similarly, U.S. Pat. No. 4,180,199, issued Dec. 25, 1979 to O'Rourke et al., describes a system for measuring dwell-time and temperature profiles of a soldering operation. In particular, dwell-time is measured by the amount of time a single electrical contact is grounded by immersion in a solder bath. The use of a single electrical contact again presumes a uniform contact-area.

SUMMARY OF THE INVENTION

We have discovered a method and apparatus that further improves the characterization of contact-area and, concomitantly, dwell-time during wave soldering. In particular, a test device has several linear arrays of electrical contacts for determining the solder wave contact-area.

In one embodiment of the invention, a PWB includes at least two arrays of electrical contacts, one array near each side of the PWB. As the PWB makes contact with a solder wave, the number of electrical contacts in each array that are grounded by the solder wave are counted and displayed on an alpha-numeric display mounted on top of the PWB. This "distance-based" measurement provides an accurate determination of the uniformity of the contact-area, and concomitantly, the dwell-time.

In another embodiment of the invention, the PWB includes at least two arrays of light-emitting diodes (LEDs). As the PWB makes contact with a solder wave, the LEDs in contact with the solder wave turn-on. An operator simply has to count the number of lit LEDs to determine the uniformity of the contact-area.

In another embodiment of the invention, the PWB includes at least two arrays of electrical contacts, one array near each side of the PWB. As the PWB makes contact with a solder wave, the number of electrical contacts in each array that are grounded by the solder wave are sampled and statistically averaged by a microprocessor located on the PWB. The calculated contact-area and dwell-time are displayed on an alpha-numeric display mounted on top of the PWB. The use of statistical averaging provides a contact-area and a dwell-time closer to the true average.

In accordance with a feature of this invention, the test apparatus behaves "like" an electronic circuit pack during the contact-area measurement because it "is" an electronic circuit assembly. A tempered glass plate does not behave in a similar manner as a PWB composed of epoxy-glass and wettable metallic features.

DETAILED DESCRIPTION

Figure 1:
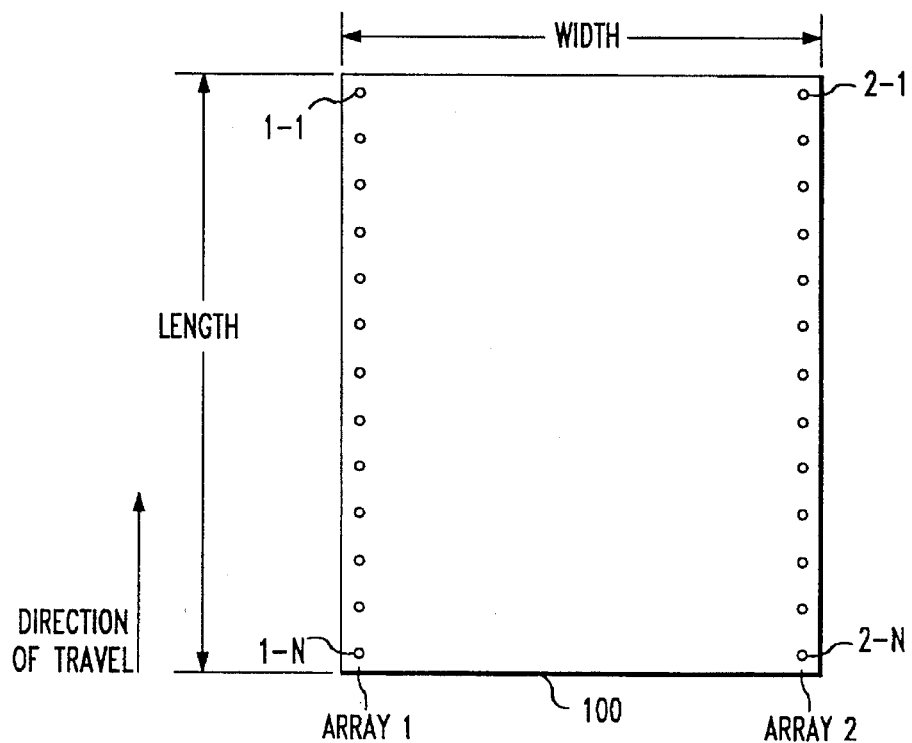
FIG. 1 shows an illustrative bottom-view of a test apparatus embodying the principles of the invention.

FIG. 1 shows an illustrative bottom-view of test apparatus 100, which embodies the principles of the invention. Other than the inventive concept, the elements of test apparatus 100 (further listed below) are well-known and will not be described in detail. Test apparatus 100 is assumed to be a PWB that includes a plurality of arrays, herein represented as array 1 and array 2. Each array includes a number of electrical contacts along the length of the PWB. As used herein, the term "length" refers to that dimension of the PWB in the direction of travel along a conveyor belt of the solder wave machine (not shown), and the term "width" refers to that dimension of the PWB perpendicular to the direction of travel. It is assumed that the width of the solder wave is larger than the width of the PWB, which is typically the case. Array 1 and array 2 represent a two-dimensional matrix of electrical contacts. Array 1 includes electrical contacts 1-1 through 1-N. Similarly, array 2 includes electrical contacts 2-1 through 2-N. Each electrical contact is simply a plated-through hole (PTH) as known in the art. As described further below, a solder wave (not shown) makes contact with the bottom of test apparatus 100 and consequently makes contact with a number of the PTHs of array 1 and array 2.

Figure 2:
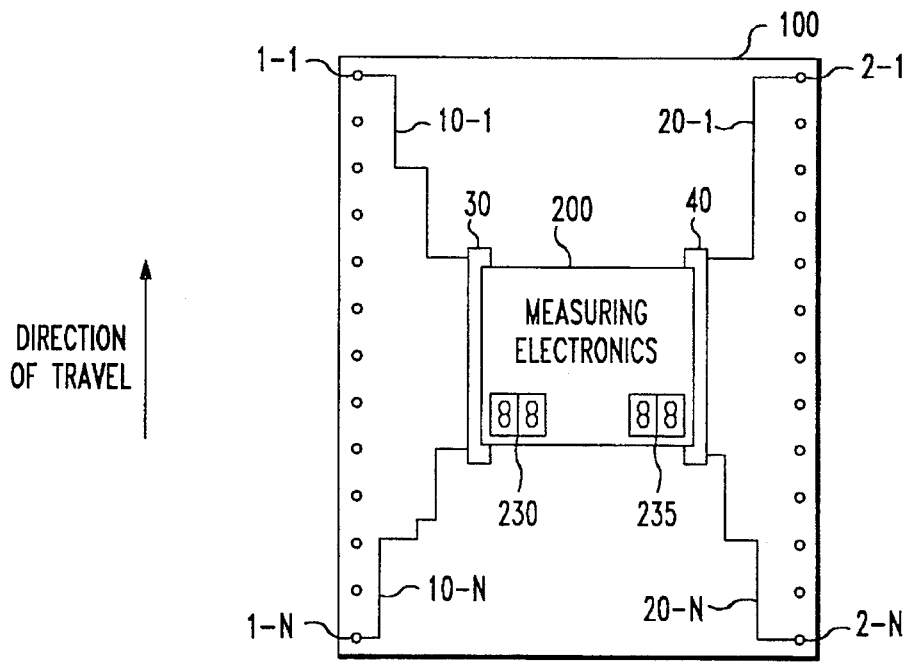
FIG. 2 shows an illustrative top-view of a test apparatus embodying the principles of the invention.

FIG. 2 shows an illustrative top-view of test apparatus 100. On the top of test apparatus 100 are connectors 30 and 40 and measuring electronics 200. Each of the PTHs of array 1 is electrically coupled to connector 30 via corresponding electrical paths 10-1 through 10-N. Similarly, each of the PTHs of array 2 is electrically coupled to connector 40 via corresponding electrical paths 20-1 through 20-N. As can be seen from FIG. 2, measuring electronics 200 includes light-emitting diode displays 230 and 235. The latter display the number of PTHs on each side of test apparatus 100 currently in contact with the solder wave. It is assumed that measuring electronics 200 plugs into connectors 30 and 40 as known in the art. It should be noted that both connectors 30 and 40 are assumed to be surface mounted, i.e., the mounting for these connectors is not through PTHs. Generally, the temperature on the top surface of test apparatus 100 is less than the temperature on the bottom surface of test apparatus 100 because of the insulating properties due to the fiber-glass construction of a typical PWB. However, if solder reflow is a problem, the solder used to construct test apparatus 100 can be a "higher-temperature" solder than that normally used in the wave solder machine. A higher-temperature solder is constructed by altering the percentage of tin and lead. For example, a solder comprising 95% lead and 5% tin changes the solder melting point to approximately 314° C. which is 50° F. higher than the typical solder set temperature of 250° C.

Figure 3:
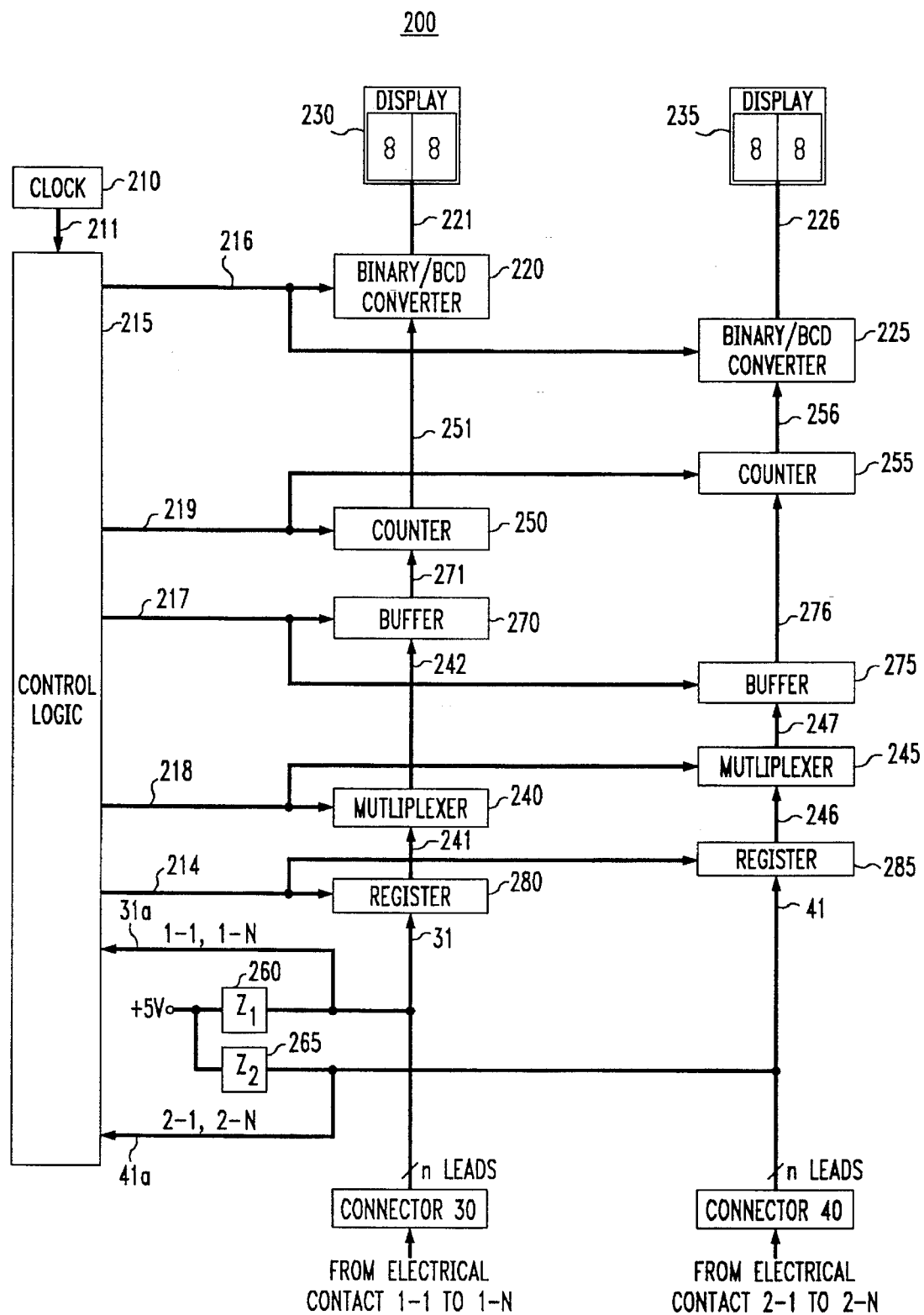
FIG. 3 is a block diagram of measuring electronics 200 embodying the principles of the invention.

FIG. 3 shows an illustrative block diagram of measuring electronics 200. The latter includes clock circuitry (clock) 210, control logic 215, binary/binary-coded-decimal(BCD) converters 220 and 225, light-emitting diode displays (displays) 230 and 235, counters 250 and 255, buffers 270 and 275, registers 280 and 285, multiplexers 240 and 245, and impedance networks 260 and 265. Inclusions of a suitable battery as a power source is presumed and not shown. Clock 210 provides a number of clock signals via line 211. Unless otherwise noted, the use of a single line in FIG. 3 is merely representative of any number of electrical connections between the corresponding circuitry of measuring electronics 200. For example, line 211 represents a number of clock signals provided by clock 210 for use by control logic 215. The latter controls the measurement and display of the contact-area as described below. For simplicity, since the circuitry associated with array 2 is similar to the circuitry associated with array 1, only the latter circuitry will be described below.

Connector 30 electrically couples the electrical signals appearing on electrical contacts 1-1 through 1-N of array 1 to register 280 via line 31. As shown in FIG. 3, each electrical contact 1-1 through 1-N, is "pulled high" to, illustratively, +5 Volts via impedance network 260. The latter is simply a plurality of resistors, where each resistor couples a corresponding electrical contact to +5 Volts. As known in the art, a solder bath effectively provides an "electrical ground." Consequently, when each electrical contact is not in contact with the solder bath, the corresponding electrical signal is "pulled high" to +5 Volts and represents a logical "ONE." Conversely, as the solder wave contacts each electrical contact, the respective contact is grounded, i.e., "pulled low," to zero Volts and represents a logical "ZERO."

Register 280, under the direction of control logic 215 via line 214, periodically latches a representation of the binary values of the electrical signals appearing on electrical contacts 1-1 through 1-N, described further below. This sampling of array 1 is performed to remove any noise that is a result of intermittent contact between the solder and an electrical contact. The output of register 280 is a corresponding set of N signals provided to multiplexer 240 via line 241.

Multiplexer 240 is assumed to be a 1-of-N multiplexer as known in the art and, in addition to the set of N electrical signals provided by register 280, also receives a set of address signals via line 218 from control logic 215. The number of address signals is simply equal to $\log_2 N$. Multiplexer 240 uses the binary value of the address signals at any point in time to select one of the sampled N electrical contacts. The output signal of multiplexer 240 is a logical ONE when the sampled electrical contact is not touching the solder bath and a logical ZERO when the sampled electrical contact is touching the solder bath. This output signal is provided to buffer 270. As described further below, buffer 270 gates the output signal from multiplexer 240 so that a negative going pulse is provided to counter 250, via line 271, whenever the sampled electrical contact is in contact with the solder wave, i.e., at a logical ZERO. Counter 250 simply counts the number of negative going pulses from buffer 270. Binary/BCD converter 220 converts the count of counter 250 to a BCD number and drives corresponding display 230 to display the count, i.e., the number of electrical contacts currently in contact with the solder wave, which also represents a respective "contact-length" of the contact-area.

Consequently, and in accordance with the inventive concept, displays 230 and 235, together provide an estimation of the contact-area of the solder wave. This number can be suitably cross-indexed via a table (not shown) that includes data listing the displayed contact-area versus conveyor speed to provide a respective dwell-time.

Figure 4:
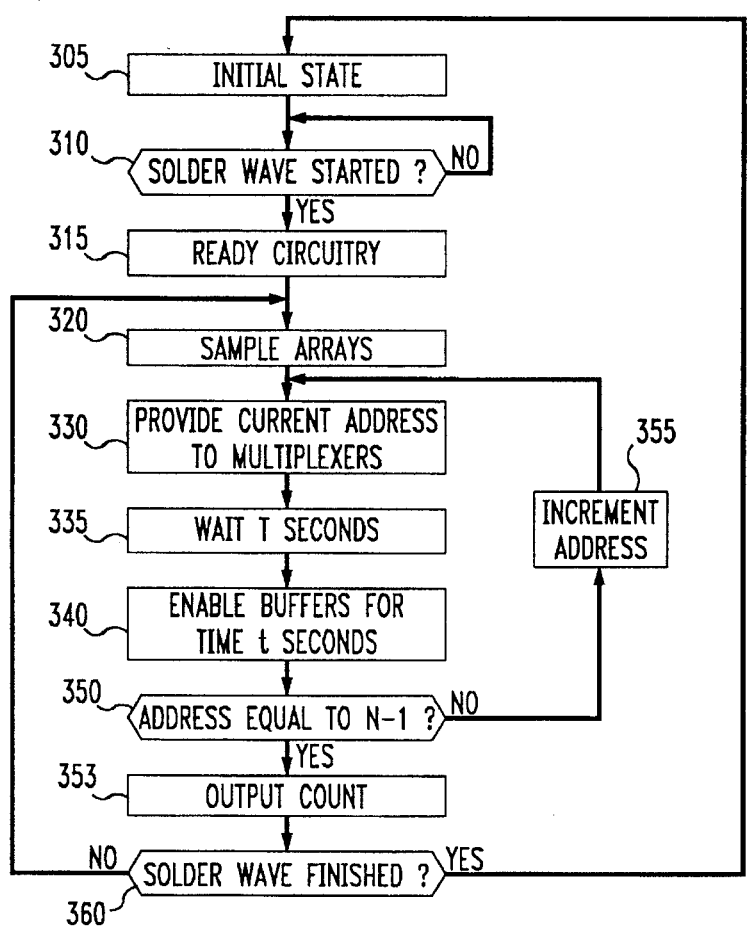
FIG. 4 is a flow diagram of an illustrative method for use in measuring electronics 200.

As noted above, control logic 215 orchestrates the measuring of a contact-area. In particular, control logic 215 is a simple state machine that executes the method shown in FIG. 4. In step 305, control logic 215 begins in an initial state in which control logic 215 inhibits counters 250 and 255 from counting, and disables buffers 270 and 275. In this state, displays 230 and 235 display the current BCD numbers provided by binary/BCD converters 220 and 225, respectively. After the initial state, control logic 215 goes to step 310 to determine if a solder wave process has started. As shown in FIG. 3, control logic 215 receives electrical contact signals 1-1 and 1-N via line 31a, and 2-1 and 2-N via line 41a. Also, referring back to FIGS. 1 and 2, it is assumed that the direction of travel on the conveyor belt (not shown) is such that either, or both, electrical contacts 1-1 and 2-1 initially make contact with the solder wave. In step 310, control logic 215 waits for a transition from a logical ONE to a logical ZERO by the signals from either of these contacts. If a logical ONE is detected, control logic 215 continues to wait for the start of a soldering process. However, if a logical ZERO is detected, control logic 215 begins the counting process. In step 315, control logic 215 clears and enables binary/BCD converters 230 and 235. As a result, displays 230 and 235 show a reading of "00." Similarly, control logic 215 clears counters 250 and 255 and disables buffers 270 and 275. It is assumed that in the disabled state, the output signals of buffers 270 and 275 conform to a logical ONE. Finally, control logic 215 provides a zero address to multiplexers 240 and 245.

In step 320, control logic 215 latches the signals presents on the electrical contacts of both arrays into registers 280 and 285, via line 214. In step 330, control logic 215 provides the current address to multiplexers 240 and 245. At this point, the current address is 0. As a result, each multiplexer provides the corresponding sampled electrical signal on output lines 242 and 247, respectively. Control logic 215 then waits for T seconds in step 335 to wait for the multiplexer output signals to become stable. In step 340, control logic 215 enables buffers 270 and 275 for a time period t. As a result, if the output signal from a multiplexer is at a logical ZERO, the respective buffer will generate a negative-going pulse to the respective counter for the time t. In step 350, control logic 215 checks if the current address is equal to N-1. If not, the current address is incremented in step 355 and the process begins again at step 330. However, if the current address is equal to N-1, binary/BCD converters 220 and 225 latch the output of counters 250 and 255, respectively, in step 353 for viewing on corresponding displays 230 and 235. Control logic 215 checks if the soldering process is finished in step 360. Electrical contacts 1-N and 2-N will be the last electrical contacts to touch the solder wave. The transition by either, or both, of these respective signals from a logical ZERO to a logical ONE is used as a signal to control logic 215 to stop the counting process. If the solder process is not yet finished, control logic 215 returns to step 320 and again samples the electrical contacts of arrays 1 and 2, etc. However, if the solder processing is finished, control logic 215 returns to step 305. The time between repeated execution of step 320 is defined herein as the sample time, i.e., the period of time between snapshots of each array. Illustratively, for a value of N equal to 64, the sample time is equal to 0.1 seconds, and both T and t are equal to 0.154 milli-seconds.

Figure 5:
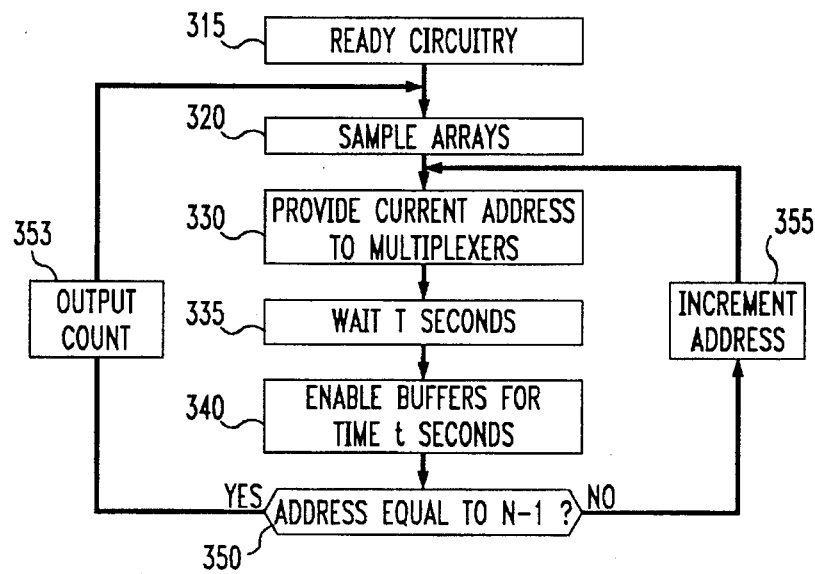
FIG. 5 is a flow diagram of another illustrative method for use in measuring electronics 200.
Figure 6:
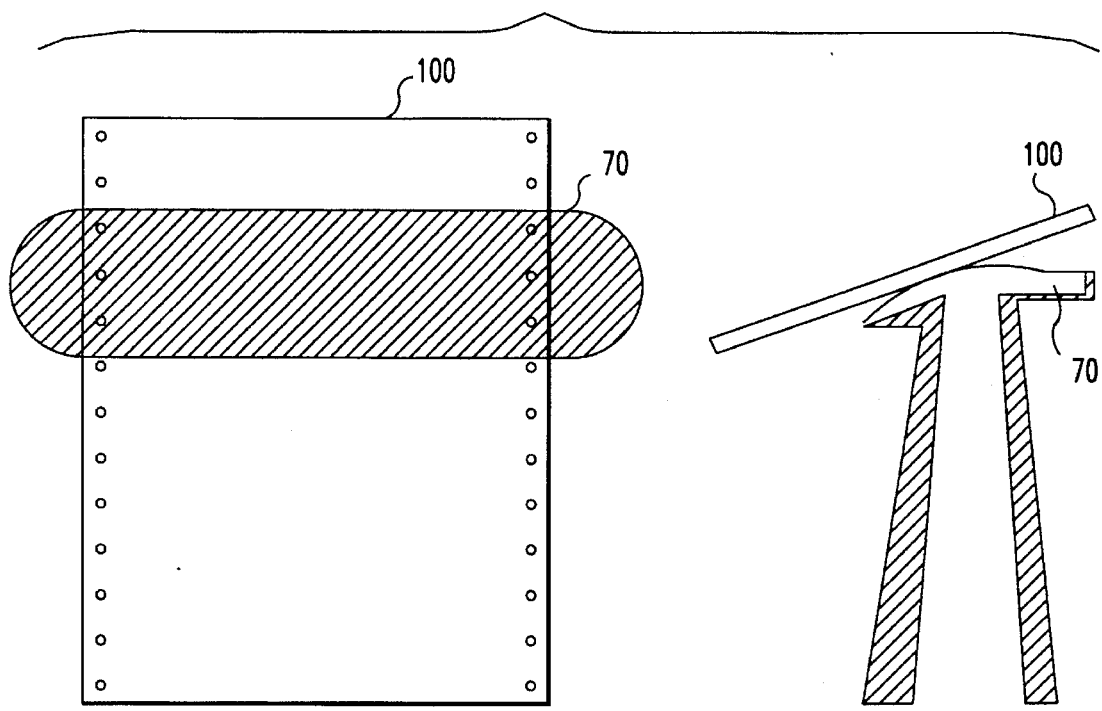
FIG. 6 illustrates a static method for measuring contact-area.
Figure 7:
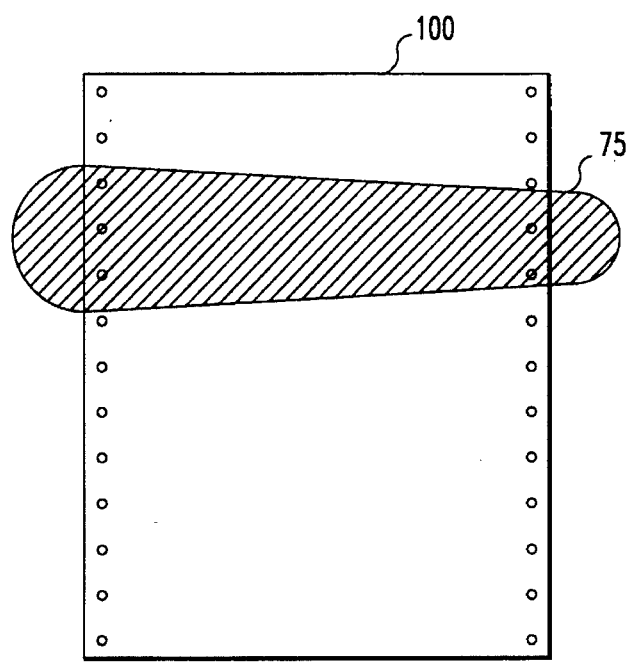
FIG. 7 illustrates an uneven solder wave.

In the above example, it is assumed that test apparatus 100 is placed on the conveyer of a solder wave machine (not shown) and moved over the solder wave. This allows control logic 215 to be triggered in step 310 when either the electrical contact 1-1 or 2-1 contact the solder wave. This method is termed the "dynamic method." An alternative method is the "static method." This method is shown in FIG. 5, which is similar to the method of FIG. 4 except that control logic 215 continuously counts and displays the number of electrical contacts in contact with the solder wave. In this method, control logic 215 begins in step 315 and when the address value is equal to N-1 returns to step 315 to start over. The static method is also illustrated in FIG. 6. In this method, test apparatus 100 is placed in a fixed position over solder wave 70. As known in the art, the solder wave is simply brought up and an operator visually inspects displays 230 and 235. As can be observed from FIG. 6, a uniform contact-area is shown, i.e., the number of electrical contacts in contact with solder wave 70 are equal. For comparison, an example of an uneven wave is shown in FIG. 7. An uneven wave can be corrected by appropriate adjustment of the guide rails typically found on a solder wave machine (not shown), or by adjustment of the solder wave form (not shown).

Figure 8:
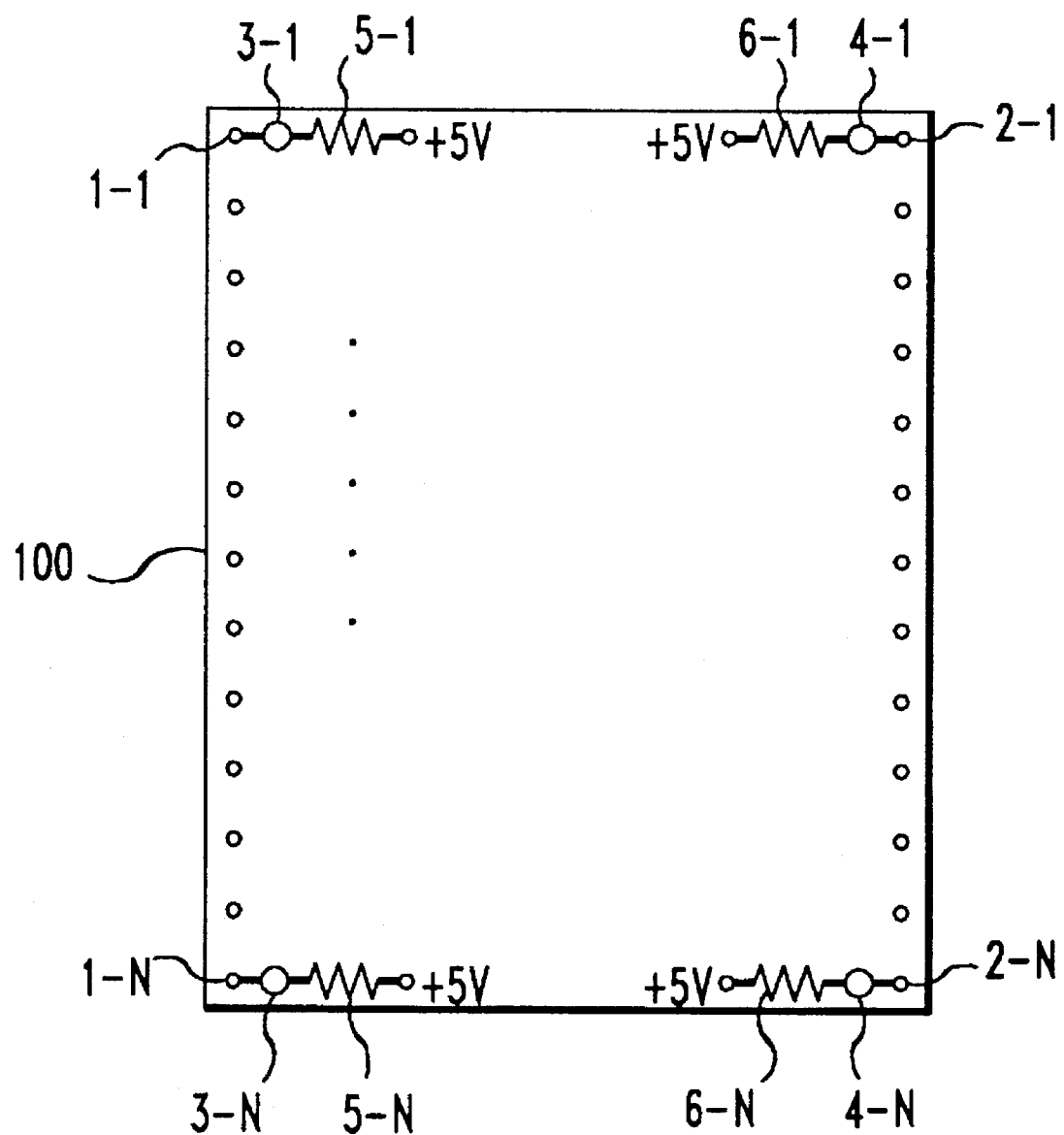
FIG. 8 shows an illustrative top-view of another test apparatus embodying the principles of the invention.
Figure 9:
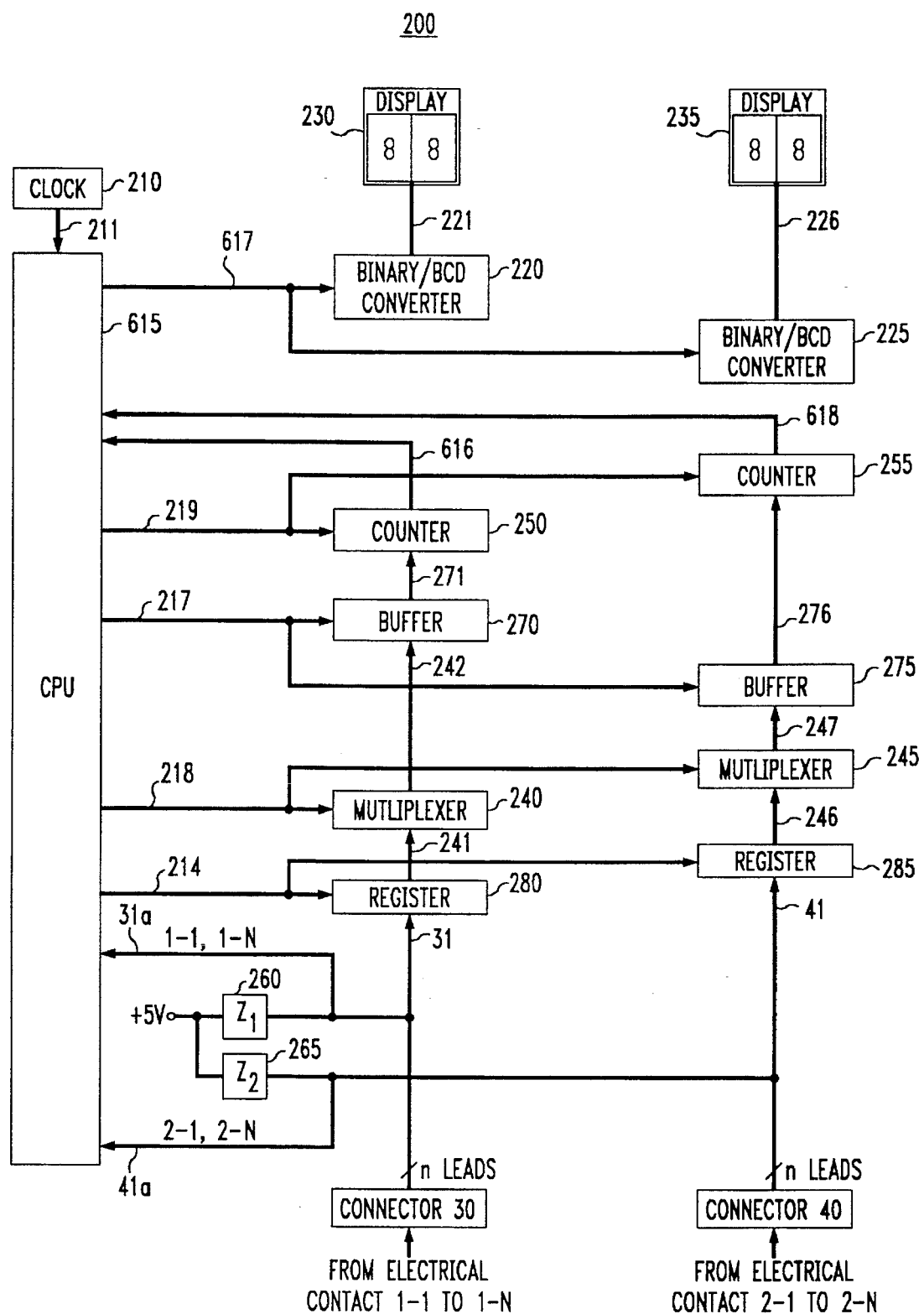
FIG. 9 is a block diagram of another embodiment of measuring electronics 200.

Other ways to measure the contact-area in accordance with the principles of this invention are also possible as illustrated by FIGS. 8 and 9. In FIG. 8, measuring electronics 200 is replaced by a two-dimensional array of LEDs. In particular, LEDs 3-1 through 3-N are coupled to corresponding electrical contacts 1-1 through 1-N, and to +5 Volts via resistors 5-1 through 5-N, respectively. Similarly, LEDs 4-1 through 4-N are coupled to corresponding electrical contacts 2-1 through 2-N, and to +5 Volts via resistors 6-1 through 6-N, respectively. A suitable battery to supply the +5 Volts is presumed and not shown. The operation of test apparatus 100 is simple. When an electrical contact is grounded by contact with the solder wave, the corresponding LED lights-up. An operator simply has to observe the number of lit LEDs, which corresponds to the contact-area. It is assumed that all components of test apparatus 100 are surface mounted. A higher-temperature solder can be used if solder reflow is a problem.

Turning to FIG. 9, another embodiment of measuring electronics 200 is shown. In this example, a microprocessor, along with suitable memory, (CPU 615) replaces control logic 215. In addition, the output signals of counter 250 are provided to CPU 615 via line 616, and CPU 615 provides the data for displays 230 and 235 via line 617 and binary/BCD converters 220 and 225. Illustratively, CPU 615 performs the method shown in FIG. 10. This method is similar to the method shown in FIG. 4 except that within step 353' CPU 615 performs statistically processing of the count information provided by counters 250 and 255. Illustratively, the number of holes connected during each sample period (the time between repeated execution of step 320') are averaged to determine the contact-area. The accuracy of the average can be adjusted by increasing or decreasing the sample time.

Figure 10:
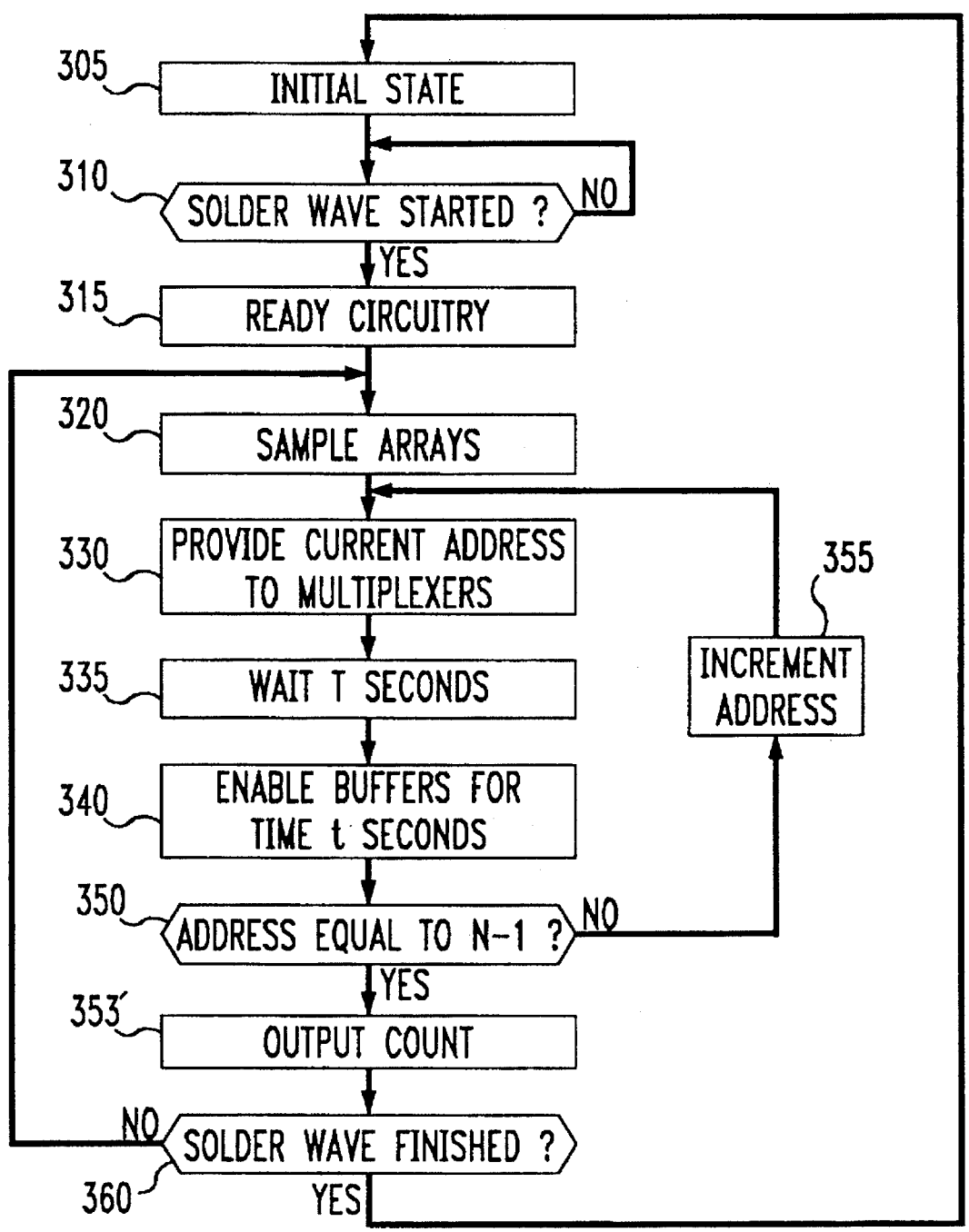
FIG. 10 is a flow diagram of another illustrative method for use in the embodiment of FIG. 9.

It should be noted that, like the measuring electronics of FIG. 3, similar modifications can be made to the method shown in FIG. 10 to accommodate a static method of measuring the contact-area. Further, the measured contact-area can be provided to adjustment electronics (not shown) to automatically adjust the solder height. For example, as disclosed in the co-pending, commonly assigned, U.S. Patent application of Massini et al., entitled "Adjustment of a Solder Wave Process in Real-Time," Ser. No. 08/342,562, filed on Nov. 21, 1994, an acoustical FM transmitter provides the measured contact-area to a computer-based system, which adjusts the solder wave height in response to the measured contact-area.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, although the invention is illustrated herein as being implemented with discrete functional building blocks, e.g., binary counters, multiplexers, etc., the functions of any one or more of those building blocks can be carried out using one or more appropriate programmed processors.

In addition, although the inventive concept was described in the context of two arrays of electrical contacts, it should be realized that any number of arrays can be used to further refine the measurement of the contact-area, i.e., a K-dimensional matrix of electrical contacts can be used where K is greater than one. Finally, it should be realized that the above-described embodiments can include other features like programmability, or user-selectability, of parameters like sample time, etc.

What is claimed:

1. Solder wave measuring apparatus, comprising:

a plurality of linear arrays of electrical contacts; and measuring circuitry coupled to the plurality of linear arrays of electrical contacts for determining the number of electrical contacts in each array that are in contact with a solder wave, where the measured numbers represent a contact-area of the solder wave.

2. The apparatus of claim 1 wherein the means for measuring statistically determines a solder wave contact-area.

3. The apparatus of claim 1 wherein the means for measuring counts the number of electrical contacts that are in contact with the solder bath to determine a set of numbers representative of a solder wave contact-area.

4. The apparatus of claim 1 wherein the measuring circuitry further includes a means for displaying a set of numbers representing the solder wave contact-area.

5. The apparatus of claim 1 wherein each linear array includes a plurality of electrical contacts extending down a length of the apparatus, where the length corresponds to a direction of travel of a solder machine.

6. The apparatus of claim 5 where each electrical contact is a plated-through-hole.

7. The apparatus of claim 5 wherein each one of the plurality of electrical contacts in each linear array is at an identical height above a reference point with respect to the remaining ones of the plurality of electrical contacts in the same linear array.

8. An apparatus for measuring a contact-area, comprising;

a printed circuit board;

a plurality of linear arrays of plated-through holes arranged on the printed circuit board so that each linear array is distributed along a length of the printed circuit board, where the length corresponds to a direction of travel of a solder wave machine; and a measuring means coupled to the plurality of linear arrays for determining a contact-area of a solder wave.

9. The apparatus of claim 8 wherein each of the plated-through holes are at the same level with respect to the solder wave.

10. A method for measuring a solder wave contact-area using a test apparatus comprising a plurality of linear arrays, where each array includes a number of electrical contacts, the method comprising the steps of:

establishing contact between a solder wave and the test apparatus;

determining the electrical contacts in each array that are grounded by contact with the solder wave to provide a set of numbers; and displaying the set of numbers, where the set of numbers represents the contact-area.

11. The method of claim 10 wherein the step of determining averages the number of electrical contacts in each array that are grounded by contact with the solder wave over a time period, T, to provide the set of numbers.

12. The method of claim 10 wherein the step of determining counts the number of electrical contacts in each array that are grounded by contact with the solder wave to provide the set of numbers.

* * * * *